United States Patent [19]

Bednarz et al.

[11] Patent Number: 4,709,370

[45] Date of Patent: Nov. 24, 1987

[54] SEMICONDUCTOR LASER DRIVER CIRCUIT

[75] Inventors: James P. Bednarz, Union County; David D. Freedman, Burlington County, both of N.J.

[73] Assignee: RCA Corporation, Princeton, N.J.

[21] Appl. No.: 744,956

[22] Filed: Jun. 17, 1985

[51] Int. Cl.⁴ .............................................. H01S 3/00
[52] U.S. Cl. ...................................... 372/38; 372/26; 372/29
[58] Field of Search ............................. 372/38, 26, 29

[56] References Cited

U.S. PATENT DOCUMENTS

| | | | |
|---|---|---|---|
| 4,009,385 | 2/1977 | Sell ....................................... | 250/199 |
| 4,366,567 | 12/1982 | Fukuzawa et al. .................. | 372/38 |
| 4,449,212 | 5/1984 | Reno .................................... | 369/44 |
| 4,674,093 | 6/1987 | Angerstein et al. ................. | 372/38 |

Primary Examiner—James W. Davie
Attorney, Agent, or Firm—Clement A. Berard, Jr.; Raymond E. Smiley

[57] ABSTRACT

A driver for driving the anode of a laser diode includes a constant-current differential switch comprising NPN transistors. Two sources supply constant current into the node where the differential switch drives the laser diode: one source supplies bias current through the laser diode; the second provides a current substantially equal to the constant current through the differential switch. When the transistor, which drives the laser diode, is turned on by a modulating signal applied to its base electrode, the current from the second source flows through it into the current source at the common emitter junction. When this transistor is turned off, the current from the second source flows through the laser diode, adding to the bias current therethrough. Under these circumstances, the total current through the laser diode exceeds the threshold for lasing action and the laser diode is turned on.

16 Claims, 3 Drawing Figures

SEMICONDUCTOR LASER DRIVER CIRCUIT

The Government has rights in this invention pursuant to a Government Contract.

This invention relates generally to driver circuits and, more particularly, to a high-speed, high current driver for driving the anode of a semiconductor laser.

BACKGROUND OF THE INVENTION

Optical recording/playback of information has been made possible by developments in the areas of lasers and thermal recording media. Recent developments have led to mass data storage systems utilizing a plurality of individually modulated laser beams to record information at extremely high data rates. For example, in U.S. Pat. No. 4,449,212, issued May 15, 1984, to C. W. Reno, a multi-track record/playback apparatus is described. In the Reno patent the light beam from a single high power laser is split into a plurality of beams which are individually modulated and focused on the surface of a recording medium. In general, systems of the Reno type use large, high power lasers which require external cooling. Furthermore, in these systems a modulator is provided to individually modulate each beam of the multiple beams being used for recording. For these reasons, prior art multi-beam systems tend to be bulky, low in efficiency, and difficult to modulate.

The development of semiconductor laser arrays is the first step to multi-channel optical recorders/players which overcomes some of the problems of the prior art multi-channel systems. The use of a monolithic array of high-power, single-mode diode lasers, which can be modulated directly and independently, represents a significant advance toward the realization of compact, efficient, high-performance recording systems.

Lasers operating reliably at high power (>20 mW at 50% duty cycle) in a stable fundamental spatial mode are required for high-data-rate optical recording. The most powerful commercially available semiconductor device having these attributes is the constricted double heterojunction large-optical-cavity (CDH-LOC) AlGaAs laser. In an array of CDH-LOC lasers, the devices may typically be separated by only 150 μm.

The use of a diode laser in a high-speed optical recording/playback system requires that the laser be biased with a current which is smaller than the laser threshold, the point above which the lasing action starts. This is necessary to minimize the delay between the input of the modulating signal to a laser and the corresponding light output from the laser. Thus, a driver circuit for use with a diode laser at the high recording speeds contemplated must include means for providing a bias current through the laser. The present invention relates to a driver circuit for use with a CDH-LOC laser diode array which provides bias currents through the laser diodes and which provides the necessary drive currents to the anode (p side) of the diodes to modulate the lasers, while maintaining electrical isolation between the diodes and further maintaining a suitable thermal and mechanical enviroment.

SUMMARY OF THE INVENTION

In accordance with the principles of the present invention, a driver circuit for a laser diode is disclosed, in which the laser diode has first and second terminals, the first terminal being coupled to a reference voltage. The laser diode has a threshold current level such that current flow through the laser diode exceeding the threshold current level causes lasing action of the laser diode.

The driver circuit comprises a current switching device having input, output and control terminals, the switching device being coupled at its input terminal to the second terminal of the laser diode. The current switching device is responsive to a first voltage level at its control terminal for enabling a first level of current from the input terminal to the output terminal, and is responsive to a second voltage level at its control terminal for disabling current flow through the switching device. The driver circuit further comprises means for supplying a constant current to the juncture of the switching device and the laser diode, wherein the constant current level is greater than the threshold current level, and the threshold current level is greater than the difference between the constant current level and the first current level.

BRIEF DESCRIPTION OF THE INVENTION

DETAILED DESCRIPTION OF THE PREFERRED EMBODIMENT

Figure 1:
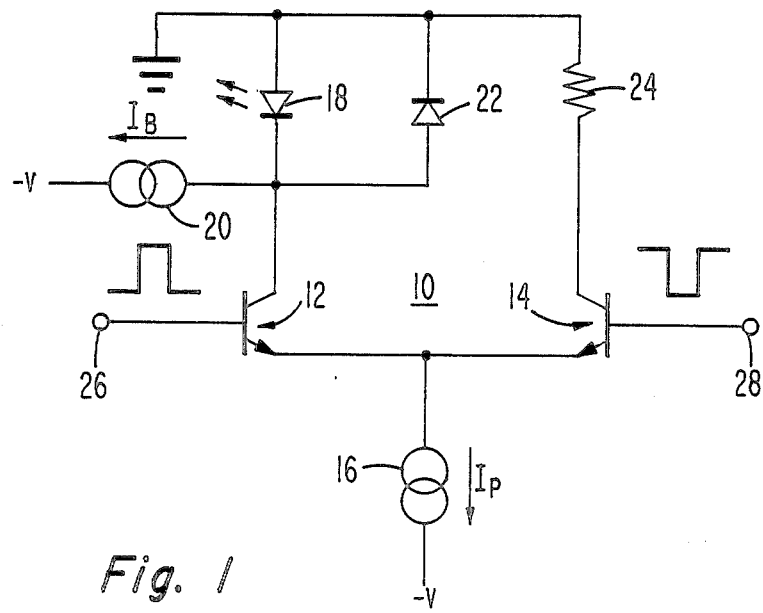
FIG. 1 is a simplified schematic diagram of a driver circuit for driving the cathode (n side) of a laser diode, according to the prior art.

Referring to FIG. 1, there is shown a simplified schematic diagram of a driver circuit for driving the cathode (n side) of a laser diode, according to the prior art. This prior art driver circuit includes NPN transistors 12 and 14 coupled at their emitters to constant current supply 16 to form differential switch 10. Laser diode 18 is coupled between the collector terminal of transistor 12 and ground such that transistor 12 drives the n side of laser diode 18.

Constant current supply 20 draws a bias current $I_B$ through laser diode 18. Current $I_B$ is set just below the threshold current level for lasing action of diode 18. Schottky diode 22 shunts laser diode 18 in the reverse direction for protection against reverse switching transients.

In a quiescent state, with laser diode 18 off, the signal level at terminal 26, coupled to the base electrode of transistor 12, is low, and the signal level at terminal 28, coupled to the base electrode of transistor 14, is high, so that transistor 12 is non-conducting and current $I_P$ flows through transistor 14 and load resistor 24. In this state, only $I_B$ flows through laser diode 18.

Laser diode 18 is pulsed on when the modulating signal and its inverse applied, respectively, at terminals 26 and 28 are pulsed, respectively, high and low. This causes current $I_P$ to switch from transistor 14 to transistor 12, making the total current flow through laser diode 18 $I_B+I_P$, which current is sufficient to produce lasing action in diode 18.

In one embodiment of this prior art drive circuit, the differential switch 10 NPN transistors 12 and 14 are of a type similar to HXTR-5104 transistors, sold by Hewlett-Packard Co., Palo Alto, Calif. These transistors are well-suited to high-speed, high-current switching applications required in the optical recording systems contemplated, as they are able to switch 200 milliamperes with rise/fall times of one nanosecond when used in this circuit configuration.

Because of heat dissipation requirements and mounting considerations, the lasers of the CDH-LOC diode array, in the present example, are mounted with their p sides down on a BeO submount. The array diodes may be electrically isolated by the use of an ion-milling technique which removes a narrow band of p-side metallization between devices, thereby separating the diodes at their anodes. It is therefore necessary to drive the lasers at their p sides, while their n sides are common to all devices. Thus, the n-side driver circuit of FIG. 1 cannot be used for this type of laser diode.

Figure 2:
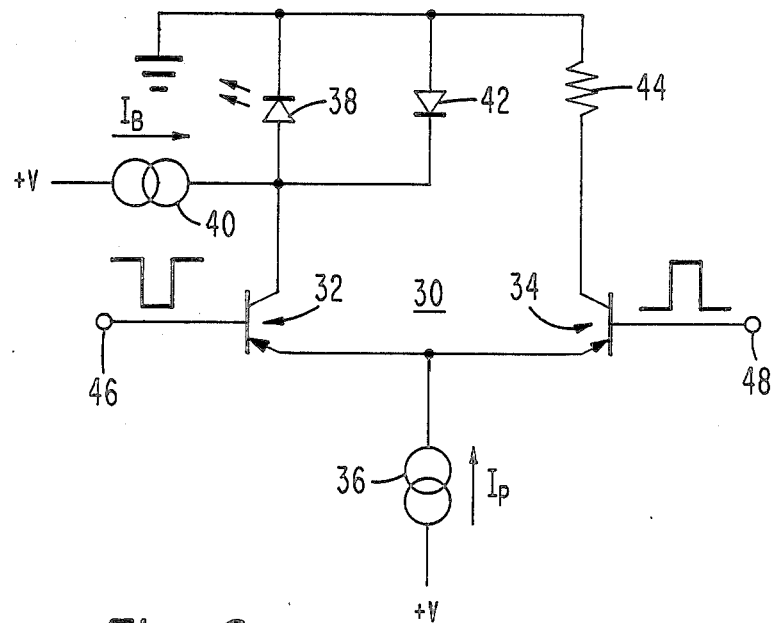
FIG. 2 is a simplified schematic diagram of a driver circuit for driving the anode (p side) of a laser diode, according to the prior art.

Referring to FIG. 2, there is shown a simplified schematic diagram of a driver circuit for driving the anode (p side) of a laser diode, according to the prior art. It will be seen that the FIG. 2 circuit is merely the circuit of FIG. 1 with the polarized elements (e.g., diodes, transistors, voltage sources, current supplies) reversed.

The driver circuit of FIG. 2 comprises PNP transistors 32 and 34 coupled at their emitters to constant current supply 36 to form differential switch 30. Laser diode 38 is coupled between the collector terminal of transistor 32 and ground such that transistor 32 drives the p side of laser diode 38, and its n side is common to all devices in the diode array. Constant current supply 40 provides a bias current $I_B$ through laser diode 38, when the collector-emitter junction of transistor 32 is an effective open circuit. Current $I_B$ is just below the threshold current level for lasing action of diode 38. Schottky diode 42 shunts laser diode 38 in the reverse direction for protection against reverse switching transients.

The operation of the driver circuit of FIG. 2 is virtually identical to that of the FIG. 1 circuit, except that $I_B$ and $I_p$ are reversed in direction. Nevertheless, the FIG. 2 prior art driver circuit is an unsatisfactory driver for CDH-LOC diode array lasers as there is no PNP transistor which is the high-speed equivalent of the NPN HXTR-5104 transistor of the FIG. 1 driver circuit. Although there are commercially available PNP transistors which are capable of switching at the high frequencies desired (over 100 MHz), there are none which can switch high current (200 mA) at the speed, with rise/fall times comparable to those of the HXTR-5104 transistor.

The high current requirement can be met by using multiple paralleled PNP transistors in place of transistors 32 and 34, but problems associated with unequal current sharing in the individual paralleled transistors, as well as the attendant increase in board area, makes this an unacceptable solution.

Figure 3:
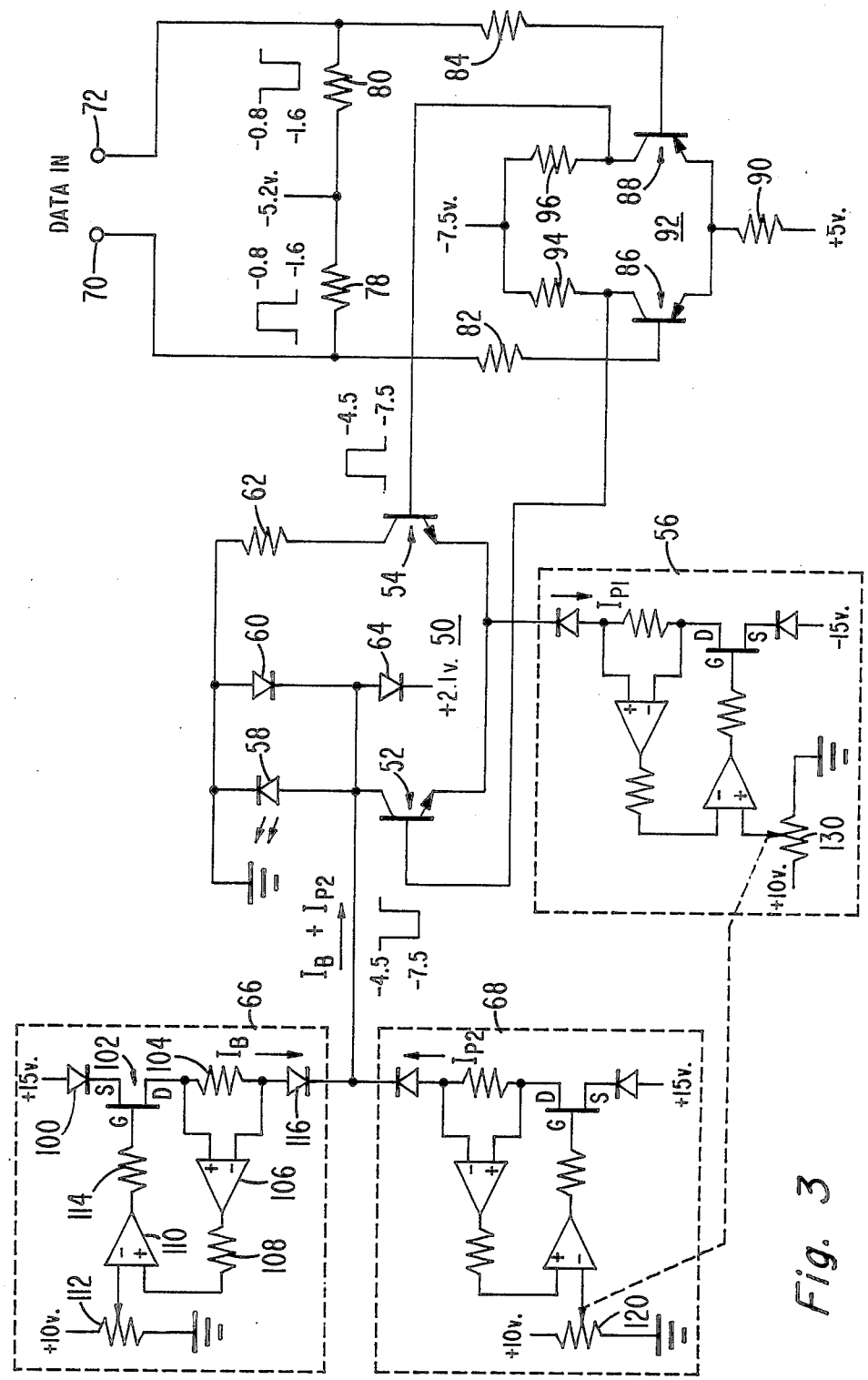
FIG. 3 is a schematic diagram of a driver circuit for driving the anode (p side) of a laser diode, according to the present invention.

Referring to FIG. 3, there is shown a schematic diagram of a driver circuit for driving the anode (p side) of a laser diode, using a differential switch comprising NPN transistors, according to the present invention. NPN transistors 52 and 54 are coupled at their emitter terminals to constant current source 56 to form differential switch 50. Laser diode 58 is coupled between the collector terminal of transistor 52 and ground such that transistor 52 drives the p side of laser diode 58, and its cathode (n side) is common to all devices in the array.

Constant current sources 66 and 68 supply current into the node where laser diode 58 is driven by transistor 52. Bias current source 66 provides a constant current $I_B$, which is just below the threshold current level for lasing action of diode 58. Current source 68 provides a pulse current $I_{P2}$, which is substantially equal to the pulse current, $I_{P1}$, which is drawn from the common emitters of transistors 52 and 54 by constant current source 56.

Schottky diode 60 shunts laser diode 58 in the reverse direction for protection against switching transients. Reverse-biased diode 64, having a typical voltage drop of 0.7 volts, is coupled between the collector of transistor 52 and a voltage source of, for example, +2.1 volts to protect transistor 52 against a large $V_{ce}$. It will be recognized by those skilled in the art that the +2.1 volt supply may be implemented as three diodes, each having a typical voltage drop of 0.7 volts, coupled in series to ground.

A laser diode modulating signal, which may typically be a double-ended digital signal from an emitter-coupled-logic (ECL) driver, is applied as the DATA IN signals at input terminals 70 and 72. In the present example, the DATA IN signals have voltage swings between −0.8 and −1.6 volts, as they are pulled down, through resistors 78 and 80, respectively, to a negative voltage source, illustratively at −5.2 volts, and are coupled through resistors 82 and 84, respectively, to the base electrodes of PNP transistors 86 and 88. Transistors 86 and 88 are coupled at their emitters, and through resistor 90 to a voltage source, which, in the present example, is +5 volts. The combination of transistors 86 and 88 configured with resistors 90 comprises differential switch 92.

Load resistors 94 and 96 are coupled, respectively between the collector terminals of transistors 86 and 88 and a negative voltage source, −7.5 volts in the present example, such that the voltage swing at the collectors of transistors 86 and 88, in response to the stated voltage swings at their bases, is −4.5 to −7.5 volts. Thus, a positive-going DATA IN signal pulse from −1.6 to −0.8 volt is applied to terminal 70 and a corresponding negative-going pulse from −0.8 to −1.6 volts is applied to terminal 72. Those pulses are inverted, amplified and voltage shifted by differential switch 92 to thereby provide a negative pulse from −4.5 to −7.5 volts at the base of transistor 52 and a corresponding positive pulse from −7.5 to −4.5 volts at the base of transistor 54. In the configuration of differential switch 50, transistors 52 and 54 are each fully turned off by a base voltage of −7.5 volts and are each fully turned on by a base voltage of −4.5 volts.

Constant current sources 56, 66 and 68 are very similar in structure; only one will be described in detail. Constant current source 66 supplies laser diode bias current $I_B$ into the node connecting the collector of driver transistor 52 with the p side (anode) of laser diode 58. The current originates from a voltage source, +15 volts in the present example, which is coupled to voltage-dropping diode 100, through field-effect transistor (FET) 102, precision sampling resistor 104, and blocking diode 116.

Differential input amplifier 106 senses the bias current $I_B$ by measuring the voltage drop across resistor 104. The output signal of amplifier 106 is coupled via resistor 108 to one input of differential input amplifier 110 functioning as a comparator. Amplifier 110 compares the output voltage from amplifier 106 with a dc voltage level provided from variable resistor 112. The output signal of comparator 110 is coupled via resistor 114 to the gate electrode of FET 102 to thereby control the current flowing therethrough. Resistors 108 and 114 act in conjunction with the input capacitances of amplifier 110 and FET 102, respectively, to slow down the loop frequency response. Variable resistor 112 is manually set to permit the desired value of bias current through FET 102. Variable resistor 120 of current source 68 and variable resistor 130 of current source 56 are ganged in their wiper terminals so that they may be adjusted in tandem. Current sources 56, 66 and 68 may typically also include wideband chokes, to isolate the dc sources from effect of the modulating signal.

In the operation of the driver circuit of FIG. 3, the normal voltage level at input terminal 70 is −1.6 volts, corresponding to a low logic state, and the normal voltage level at input terminal 72 is −0.8 volts, corresponding to a high logic state. These input signal levels translate to a normal voltage level of −4.5 volts (high) at the base of transistor 52 and a normal voltage level of −7.5 volts (low) at the base of transistor 54. Thus, in the normal state, transistor 52 is fully conducting, drawing current $I_{P1}$, which is substantially equal to the current $I_{P2}$ supplied by current source 68, and transistor 54 is fully off. In this normal state, laser diode 58 draws $I_B$ from current source 66, which biases the diode at a level below its lasing threshold.

With the occurrence of a positive-going pulse at input terminal 70 from its normal −1.6 volt level to −0.8 volts, and a corresponding negative-going pulse at input terminal 72 from its normal −0.8 volt level to −1.6 volts, the voltage levels at the bases of transistors 52 and 54 reverse. This reversal causes transistor 54 to be fully conducting and transistor 52 to be fully off. Fully-on transistor 54 draws $I_{P1}$ from ground through load resistor 62 into current source 56. Fully-off transistor 52 conducts no current, so the total current $I_B + I_{P2}$, applied to its collector, is conducted through laser diode 58, exceeding the threshold current and turning the device on.

A driver circuit of the type shown in FIG. 3 and described herein has been built and its performance has been measured. The driver has switched a maximum pulse current of 200 milliamperes with pulse rise/fall times of one nanosecond, at a pulse frequency rate in excess of 75 MHz.

It has been noted that the currents supplied by current sources 56 and 68 are substantially equal, and it has further been shown that current-adjusting variable resistors 120 and 130 are ganged so that they may be set jointly. If current sources 56 and 68 are not properly matched, current is either substracted from bias current source 66 (for the case where $I_{P1} > I_{P2}$) or added to bias current source 66 (for the case where $I_{P1} < I_{P2}$). In the present example, it is desired to maintain currents $I_{P1}$ and $I_{P2}$ within three milliamperes of each other.

In the detailed design of the driver of FIG. 3, consideration must be given to the turn-on characteristics of current source 56 and 68 in order to avoid transient current spikes to laser diode 58. One such protective measure involves ensuring that current source 56 is turned on before current source 68 during the power-up cycle, and that current source 68 is turned off before current source 56 when shutting the system down.

While the principles of the present invention have been demonstrated with particular regard to the illustrated structure of the figures, it will be recognized that various departures from such illustrative structure may be undertaken in the practice of the invention. The scope of this invention is not intended to be limited to the structure disclosed herein but should instead be gauged by the breadth of the claims which follow.

What is claimed is:

1. A driver circuit for a laser diode, said laser diode having first and second terminals, said first terminal of said laser diode being coupled to a reference voltage, said laser diode having a threshold current level such that current flow through said laser diode exceeding said threshold current level causes lasing action of said laser diode, said driver circuit comprising:
    a current switching device having input, output and control terminals, said switching device being coupled at said input terminal to said second terminal of said laser diode, said current switching device being responsive to a first voltage level at said control terminal for enabling a first level of current from said input terminal to said output terminal and responsive to a second voltage level at said control terminal for disabling current flow through said switching device; and
    means for supplying a constant current to said input terminal, for supplying a level of said constant current which is greater than said threshold current level and less than the sum of said threshold current level and said first current level.

2. The driver circuit according to claim 1 wherein said current switching device includes an NPN transistor biased to conduct current from its collector electrode to its emitter electrode when said first voltage level is applied to its base electrode.

3. The driver circuit according to claim 1 further including a Schottky diode in shunt relationship to said laser diode, said Schottky diode being oppositely poled with respect to said laser diode.

4. The driver circuit according to claim 1 further including a protection device in shunt relationship to said laser diode for protecting said current switching device, said protection device conducting current when the reverse voltage across said laser diode exceeds a predetermined value.

5. The driver circuit according to claim 4 wherein said protection device is a reversed-biased diode, and said predetermined value of reverse voltage is approximately 2.8 volts.

6. A driver circuit for a laser diode, said laser diode having first and second terminals, said first terminal of said laser diode being coupled to a reference voltage, said laser diode having a threshold current level such that current flow through said laser diode exceeding said threshold current level causes lasing action of said laser diode, said driver circuit comprising:
    a differential switch including two current switching devices, each of said devices including an input, output and control terminal, each of said current switching devices being responsive to a first voltage level at said control terminal for enabling a first level of current flow from said input terminal to said ouput terminal, and responsive to a second voltage level at said control terminal for disabling current flow through said switching device, said two current switching devices being joined at their output terminals, wherein one of said current switching devices is joined at its input terminal to said second terminal of said laser diode;
    a first constant-current supply coupled to the juncture of said two output terminals for drawing said first level of current from said differential switch;
    signal generating means for applying signals of said first and second voltage levels in complementary mode to the control terminals of said two current switching devices; and a second constant current supply coupled to the juncture of said one current switching device and said laser diode, said second current supply providing a second current level which is greater than said threshold current level and less than the sum of said threshold current level and said first current level.

7. The driver circuit according to claim 6 wherein each of said current switching devices includes an NPN transistor biased to conduct current from its collector to its emitter electrodes when said first voltage level is applied to its base electrode.

8. The driver circuit according to claim 6 further including a Schottky diode in shunt relationship to said laser diode, said Schottky diode being oppositely poled with respect to said laser diode.

9. The driver circuit according to claim 6 further including a device in shunt relationship to said laser diode for protecting said one current switching device, said protection device conducting current when the reverse voltage across said laser diode exceeds a predetermined value.

10. The driver circuit according to claim 9 wherein said protection device is a reversed-biased diode, and said predetermined value of reverse voltage is approximately 2.8 volts.

11. In combination:
a differential switch including two current switching devices, each of said devices including an input, output and control terminal, each of said current switching devices being responsive to a first voltage level at said control terminal for enabling a first level of current flow from said input terminal to said output terminal, and responsive to a second voltage level at said control terminal for disabling current flow through said switching device, said two current switching devices being joined at their output terminals;
a first constant-current supply coupled to the juncture of said two output terminals for drawing said first level of current from said differential switch;
a laser diode coupled between the input terminal of one of said two current switching devices and a reference potential, said laser diode poled so as to conduct current away from said one current switching device, said laser diode having a threshold current level such that current flow through said laser diode exceeding said threshold current level causes lasing action of said laser diode;
signal generating means for applying signals of said first and second voltage levels in complementary mode to the control terminals of said two current switching devices; and
a second constant current supply coupled to the juncture of said one current switching device and said laser diode, said second current supply providing a second current level which is greater than said threshold current level and less than the sum of said threshold current level and said first current level.

12. The combination according to claim 11 wherein each of said current switching devices includes an NPN transistor biased to conduct current from its collector to its emitter electrodes when said first voltage level is applied to its base electrode.

13. The combination according to claim 12 wherein said laser diode is coupled at its p side to said one current switching device.

14. The combination according to claim 11 further including a Schottky diode in shunt relationship to said laser diode, said Schottky diode being oppositely poled with respect to said laser diode.

15. The combination according to claim 11 further including a device in shunt relationship to said laser diode for protecting said one current switching device, said protection device conducting current when the reverse voltage across said laser diode exceeds a predetermined value.

16. The combination according to claim 15 wherein said protection device is a reverse-biased diode, and said predetermined value of reverse voltage is approximately 2.8 volts.

* * * * *